United States Patent [19]

Finnerty

[11] Patent Number: 5,113,352

[45] Date of Patent: May 12, 1992

[54] INTEGRATING THE LOGICAL AND PHYSICAL DESIGN OF ELECTRONICALLY LINKED OBJECTS

[75] Inventor: James L. Finnerty, Lexington, Mass.

[73] Assignee: Digital Equipment Corporation, Maynard, Mass.

[21] Appl. No.: 372,715

[22] Filed: Jun. 20, 1989

[51] Int. Cl.$^5$ .............................................. G06F 15/60
[52] U.S. Cl. .................................... 364/490; 364/489; 364/488
[58] Field of Search ................. 364/488, 489, 490, 491

[56] References Cited

U.S. PATENT DOCUMENTS

| T944,001 | 3/1976 | Hanan et al. | 364/490 |
| 3,622,762 | 11/1971 | Dyer | 364/488 |
| 3,681,782 | 8/1972 | Scanlon | 364/491 |
| 3,702,003 | 10/1972 | Ramirez et al. | 364/489 |
| 4,263,651 | 4/1981 | Donath et al. | 364/491 |
| 4,495,559 | 1/1985 | Gelatt, Jr. et al. | 364/491 |
| 4,918,614 | 4/1990 | Modarres et al. | 364/490 |
| 4,924,430 | 5/1990 | Zasio et al. | 364/578 |

OTHER PUBLICATIONS

"MIS: A Multiple-Level Logic Optimization System" by R. K. Brayton et al., IEEE Trans. on Computer-Aided Design, vol. CAD-6, No. 6, Nov. 1987, pp. 1062-1081.

"Timing Influenced Layout Design" by M. Burstein, IEEE 22nd Design Automation Conf., 1985, pp. 124-130.

"Lores: Logic Reorganization System" by S. Nakamura et al., IEEE 15th Design Automation Conf. 1978, pp. 250-260.

"Timing-Analysis for nMOS VLSI" by N. P. Jouppi, IEEE 20th Design Automation Conf., 1983, pp. 411-418.

"Partitioning and Placement Technique for CMOS Gate Arrays" by G. Odawara et al., IEEE Trans on Computer-Aided Design of Integrated Circuits & Systems, CAD 6 (1987) May, No. 3, pp. 355-363.

"Switch-Level Delay Models for Digital MOS VLSI" by J. K. Ousterhout IEEE 21st Design Automation Conf., 1984, pp. 542-548.

Primary Examiner—Parshotam S. Lall
Assistant Examiner—V. N. Trans
Attorney, Agent, or Firm—Kenyon & Kenyon

[57] ABSTRACT

The interconnection costs of electronically linked objects is minimized by the successive partitioning of the initial logic design. The partitioning is based upon the electrical properties of the drivers and loads of the linked objects forming the design. Further, time critical connections are weighted so as to further minimize interconnection cost. A further method refines the result of the successive partitioning by calculating each linked object's contribution to the overall delay of the design. Both the design of device function and timing and the physical realization of the electronically linked objects are solved jointly to make use of the information available from the logical and physical designs.

4 Claims, 6 Drawing Sheets

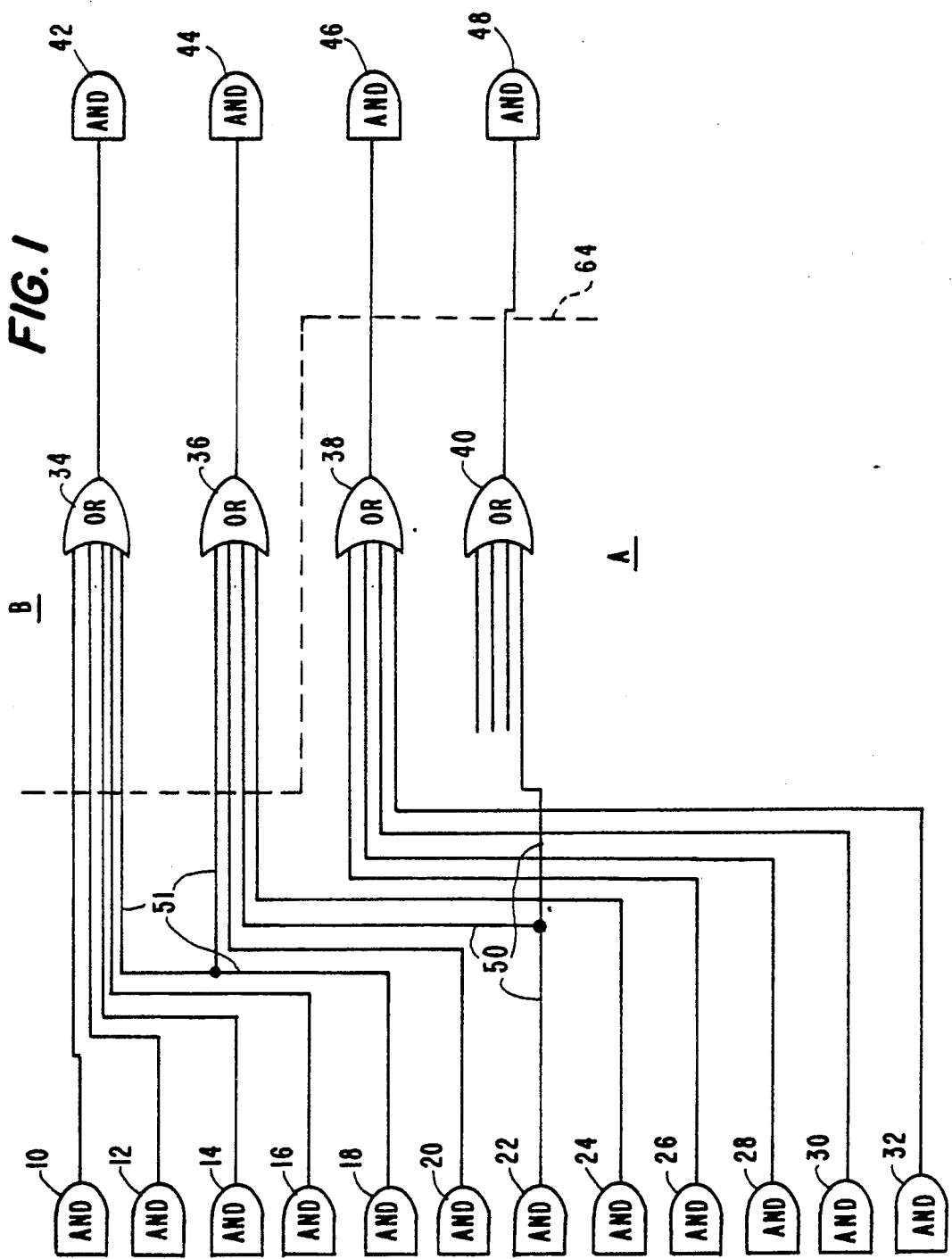

INTEGRATING THE LOGICAL AND PHYSICAL DESIGN OF ELECTRONICALLY LINKED OBJECTS

FIELD OF THE INVENTION

The invention relates to a method for performing physical design of electronic systems by partitioning electronically linked objects into sets and, more particularly, for partitioning the linked objects to minimize the propagation delay of the interconnections.

BACKGROUND OF THE INVENTION

This application relates generally to the copending application entitled "Minimizing The Interconnection Cost of Electronically Linked Objects" filed on an even date herewith.

Complex electronic circuits have traditionally been designed in two phases: logical design and physical design. Logical design is the process for defining the correct operation of the circuit and the necessary components to achieve that operation. Physical design includes the placement or layout of the logical design to meet the physical constraints of the hardware.

A major problem in this design process for modern electronic systems has been the positioning of the components or models and the routing of their connections on the physical layout of the semiconductor chip in a manner which maximizes design performance, i.e., speed. The semiconductor chip only has a fixed area which accommodates a set number of placement slots to hold the models. Also, the semiconductor chip only has a fixed number of external terminals or pins by which the models located thereon can be coupled to other semiconductor chips. Other constraints which must be accounted for in the electronic physical design of the chip include the operational or mechanical considerations which dictate that a particular set of models must be on the same chip or that certain models must be on different chips.

With the advent of very large scale integrated circuits (VLSI), and their mass production, the number of placement slots that can be placed in a limited area has increased dramatically. The placement of the logical design on the semiconductor chips must now be achieved with respect to the size of the chips, constraints on design performance, and the time necessary to solve the layout design. Therefore, not only must the layout be an efficient design but also the development of the layout must be performed efficiently.

In order to fully understand the field of the invention the following glossary of terms are set forth and are used throughout the specification:

A "model" is an indivisible logic function block, e.g., AND gate, OR gate, XOR gate, etc.

A "port" is any input or output of a model.

A "signal" is a set of electrically common ports.

A "load" is defined as the input port to a model.

A "driver" is defined as the output port from a model.

A "connection" is a single path between two ports of a signal.

A "path" is a sequence of connections, ports, and models along which an electrical signal travels.

A "design" is the collection of named models, ports, and signals.

The word "partition" is used interchangeably as both a noun and a verb in the following description, i.e. a set of models is partitioned into further partitions, and these further partitions are disjoint and collectively exhaustive.

A "cut-set" is the set of connections linking models which have been assigned to different partitions.

The "cost" of a partition is the weighted sum of the costs of the connections in its cut-set.

A "location" of a port or model is a unique (x, y) coordinate which fixes the port or model position on the substrate.

The "delay" of a model or signal connection is the amount of time required to pass a signal through the model or connection. Path delays are the sum of model and signal delays along a path.

A "timing constraint" is the maximum allowable delay along a path. The maximum allowable delay may include both signal connection and model delays.

A "timing debt" is the number of time units by which the path delay exceeds the worst case timing constraint.

A "critical driver/load" is a driver or load in a cut-set having a delay approaching that of the timing constraint.

A "noncritical driver/load" is a driver or load in a cut-set having a delay that does not approach that of the timing constraint.

A "placement slot" is a location at which a model may be placed on the substrate.

A "swap" is the action of exchanging the contents of two different placement slots.

The total "gain" of a swap of two models is the sum of the costs of its connections at the old locations minus the sum of the costs of its connections at the new locations. Gain can be negative or positive.

The "partial gain" of a model is that part of the total gain which results from moving one model to another partition.

An "ordered bucket vector" is a linked list data structure existing for each partition to order the models in accordance with their partial gains. The ordered bucket vector allows for the fast insertion or deletion of the model from the linked list structure.

The "cumulative gain" is the sum of the gains of a sequence of swaps. The cumulative gain therefore may also be either positive or negative.

One prior known method for the placement of electrical components or models by partitioning makes use of a cost matrix to define the cost of connecting a particular model to each of the other models on the chip. The method initially defines an arbitrary partition of the models in the logical design. The cost matrix is then used to compute the total cost of the connections between the sets of the partition, wherein each set represents a supporting structure, i.e., each set may itself contain interconnections of models. A series of interchanges of particular subsets within each set are attempted to decrease the total interconnection cost. Once no further improvements are possible, the resulting partitions are stored and the process is repeated with a randomly different initial partition. Each resulting partition is potentially an improved solution, and any particular partition may be used to assign models to locations on the semiconductor chips.

A problem with the previous known partitioning methods is that the partitioning neglects important electrical properties of the connections between models. Some of the prior methods do not factor into account the relationship between time-critical drivers and loads of the models (wherein one model has an output port which drives the input port of another model) or do so in an inefficient manner. The existing partitioning methods either ignore signals with more than three ports entirely or consider all connections of a signal uniformly, i.e., there is no distinction between connections of a signal. As a result, bad solutions which place critical connections in a cut-set appear equivalent to good solutions which contain them within a partition.

SUMMARY OF THE INVENTION

The present invention overcomes the problems associated with the above-described methods by providing a novel method to minimize the weighted interconnection costs between partitions of electronically linked objects. This method optimizes path delays across models rather than individual signals between models, as is done in the prior art. The invention thus enables electronic designs to operate at higher speeds while reducing the time required to perform the logical and physical design of the system.

The present invention is achieved by a graph partitioning method which accurately accounts for critical driver-load connections on an individual basis. The partitioning of an entire design only requires a number of steps which is linear with the number of ports in the design.

Further, the present invention provides a second pairwise-interchange method for evaluating the effect a port has on the overall signal length without explicitly representing the connections or ordering the ports of the models. This results in a fast and highly accurate swapping procedure used in the pairwise interchange method.

The combination of the partitioning method and pairwise interchange method improves both the quality of the solution for the design and the time required to perform the method.

The invention further provides for the integration of the logical and physical design processes to enable the electronic designs to operate at higher speeds and to reduce the time required to complete the design processes. The physical design is initially constructed based on timing information derived from the logical design. The logical redesign is performed based on the placement information obtained during the physical design.

BRIEF DESCRIPTION OF THE DRAWINGS

FIG. 1 is a schematic example of a logic circuit operated upon by the present invention.

DETAILED DESCRIPTION OF THE INVENTION

Minimizing Interconnection Cost

Figure 1A:
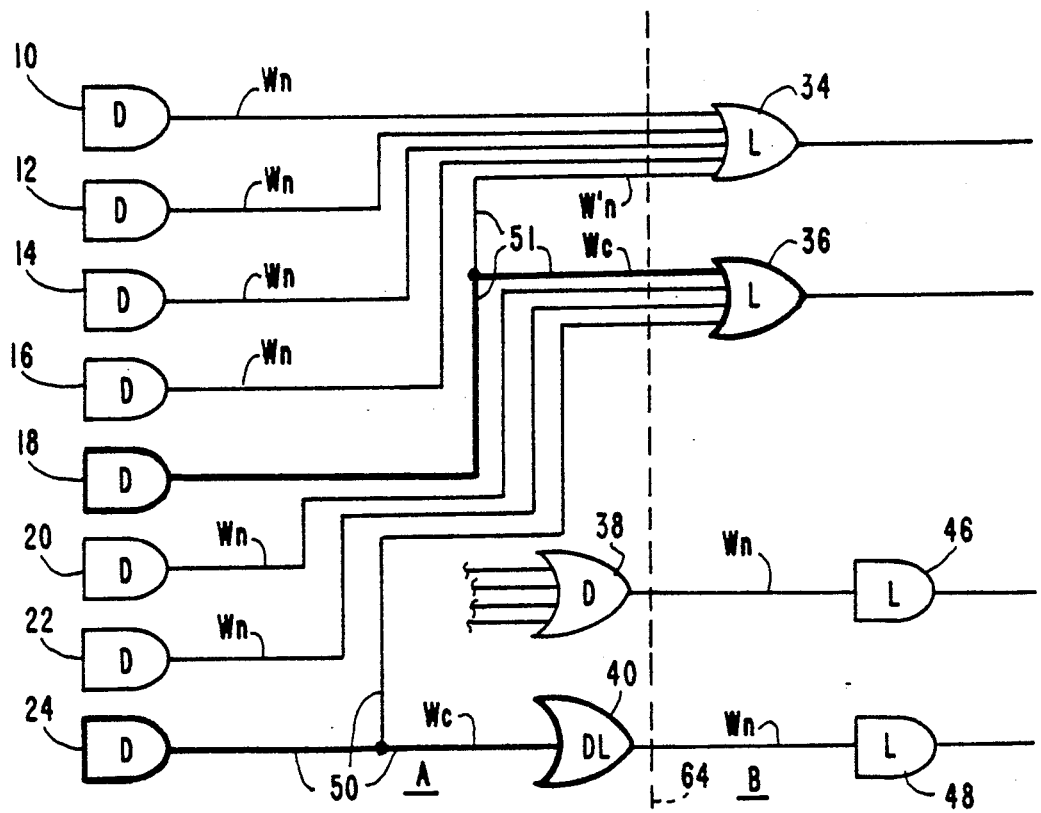
FIG. 1A is an example of a cut-set of FIG. 1.

Referring now to FIG. 1, there is shown an example of a logic circuit design which may be placed on a chip during the physical design process by the present invention. The logic circuit includes a first level of AND gate models 10-32 coupled to a level of OR gate models 34-40. The OR gate models are further coupled to a second level of AND gate models 42-48. Each of the models 10-48 have at least one input port and one output port. Signals 50 and 51 are illustrated connecting the electrically common ports of models 22, 36, 40 and 18, 34, 36 respectively. The output port of a model is a driver of a signal. The input port of a model is a load of a signal. The signals couple the output to input ports of various models. Any of the paths between any two ports of a signal 50, 51 such as between the output port of AND gate model 22 and the input port of OR gate model 36, or the output port of AND gate 22 and the input port of OR gate model 40, is an example of a connection.

Figure 2:
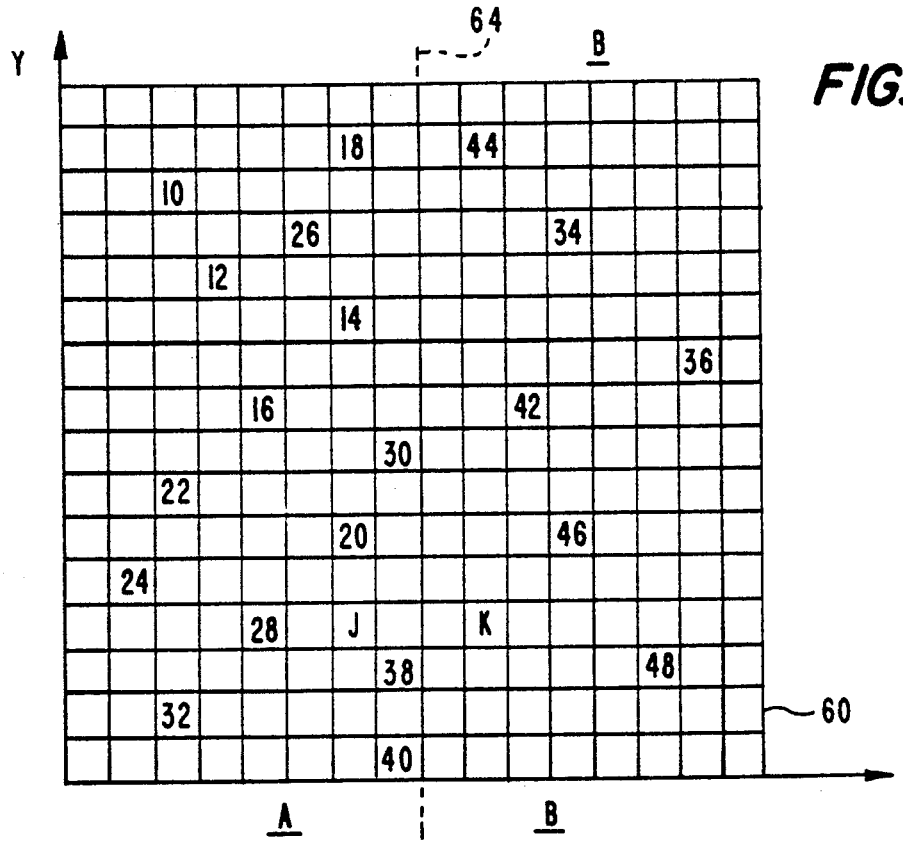
FIG. 2 is a block diagram illustrating the placement of models on a semiconductor chip.

FIG. 2 illustrates by example a semiconductor chip having a plurality of placement slots designated by their x, y coordinates. Each placement slot is a location at which one of the models may be physically placed. The locations are defined using an x-y coordinate system to fix their position on the chip 60. Each of the models 10-48 illustrated in FIG. 1 can therefore be located in a placement slot on the chip 60 of FIG. 2. The chip 60 is then partitioned into sections A and B as indicated by dashed line 64.

Referring back to FIG. 1, it is assumed that the partitioning of the chip 60 splits the logical design as indicated by dashed line 64. It can now be seen in FIG. 1, that the cut-set includes those connections which link models 10-24, 38 and 40 of partition A with those models 34, 36, 46 and 48 assigned to partition B as shown in FIG. IA. The cost of forming partitions A and B can then be determined based upon the weighted sum of the costs of the connections in the cut-set.

This cost is determined using a weighting procedure for differentiating between critical load/driver and noncritical load/driver port connections in a cut-set.

The critical or noncritical nature of the ports can be determined using a three step procedure. First, the predetermined timing constraints are supplied for the outputs of the logic circuit. From those timing constraints, the model and wire delays are subtracted. By working backward through the circuit, the arrival time necessary to satisfy the timing constraints are determined. Second, the reverse operation is carried out, i.e., from the arrival time of the input signals the delays of the models are added to the arrival time going forward through the circuit. This determines the actual output time of the signal. Third, the determined arrival and output times are then compared to the actual values to obtain a timing debt. The timing debt indicates whether the ports of the connection are critical or noncritical, i.e., critical ports have a determined time greated than that of the timing constraint and noncritical ports have a determined time less than the actual time.

For example, FIG. 1A illustrates the cut-set formed by the partitioning of the logical design in FIG. 1. AND gates 10-24 along with OR gate 38 have drivers which are in the cut-set. OR gates 34, 36 and AND gates 46, 48 have loads which are part of the cut-set. Note that OR gate 40 has a load on signal 50, driven by AND gate 24, and also drives a signal which has a single load on AND gate 48. The critical loads and drivers are indicated by the heavy lines as shown in FIG. 1A. The non-critical driver/load connections are assigned a weight of $W_N$ and the critical driver/load connections are assigned a weight of $W_c$. The cost of partitioning the design into partitions A and B is the weighted sum of the costs of the connections in the cut-set. In the examples of FIG. IA, the cost "C" of the partition equals: $C = 9W_N + 2W_c$.

It is further observed that if moving a port from one partition to another does not affect the signal which crosses the cut-set, as occurs with two or more ports of a signal on both sides of a partition, then the partial gain of this port equals 0, e.g. $W'_N = 0$ as shown in FIG. 1A.

As seen from FIG. 2, a swap is the action of exchanging the contents of two different placement slots located in separate partitions. For example, placement slot J located in partition A and placement slot K located in partition B may have their contents swapped with each other.

Figure 3:
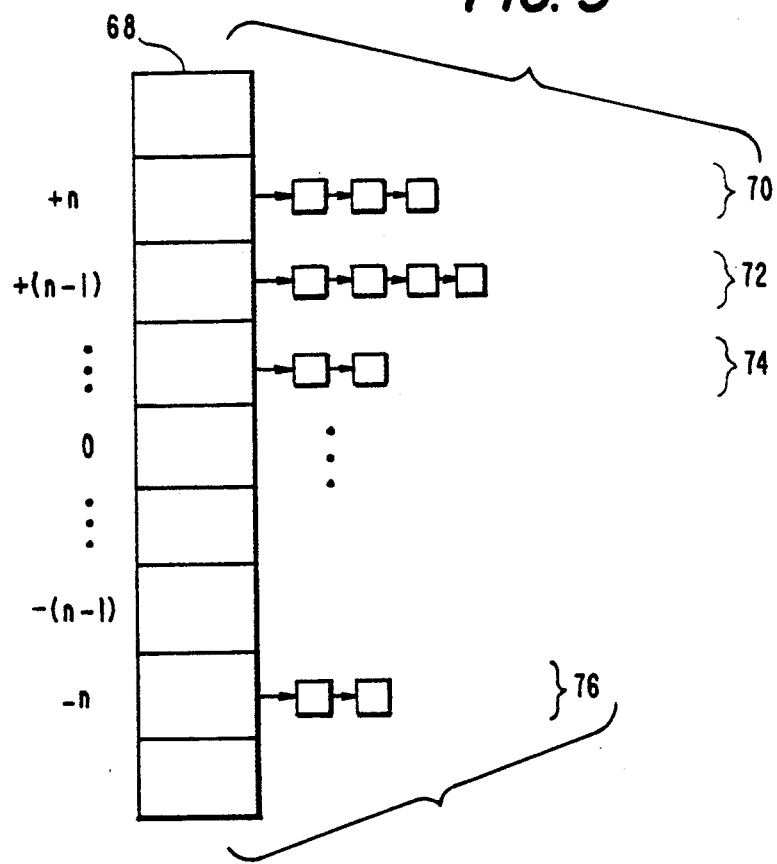
FIG. 3 shows a linked list data structure used in the present invention.

FIG. 3 is a block diagram of an ordered bucket vector 68 used in the partitioning method. The ordered bucket vector 68 is an organization in memory, i.e. a data structure. The data structure forms linked lists 70-74 for storing the partial gains of a model in the physical design process. The ordered bucket vector 68 orders the models in a partition from the models having the least partial gain (minus N) to the models having the highest partial gain (plus N). Linked lists 70, 72, 74 and 76 are formed for each set of models having the same partial gains, i.e. minus N to plus N. The ordered bucket vector 68 allows for fast insertion or deletion of models from the linked lists 70-74 during the swapping action which occurs in carrying out the invention. Ordered bucket vectors are well known as described in the article "A Linear-Time Heuristic for Improving Network Partitions" Proc. 19th Design Automation Conference, 1982.

Figure 4:
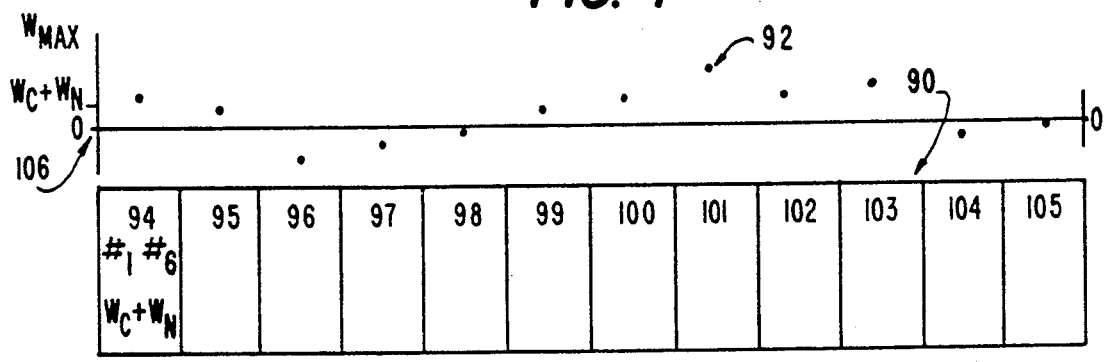
FIG. 4 shows a linked list data structure used in the present invention.

FIG. 4 shows an example of a swap history vector 90 used in the partitioning method along with an illustrative graph of a possible cumulative sum of partial gains for the vector 90. The operation of the swap history vector 90 is described below in conjunction with a pass through the method of the invention.

The method and apparatus for minimizing the propagation delay of the connections between models by successively and recursively partitioning the design and the handling of time-critical connections will now be described.

Proper operation of the method requires a processor to make a successive number of passes through the partitioning procedure. The successive passes are employed on random initial solutions of the logical design to obtain the best or a local minima solution. That solution is then accepted and the partitioning procedure is again applied to each resulting partition A and B.

During the first pass, the initial placement or solution is generated either randomly or by some other method which assigns models to placement slots. For example, an initial solution to FIG. 1 places the models in the placement slots as shown in FIG. 2.

The initial assignment or solution is then bisected into two partitions as shown by dashed line 64 in the example of FIG. 2. A linked list data structure (not shown) is then constructed by a processor for each partition A and B. The data structure contains the placement slots which are within each boundary A and B. The partial gain for each placement slot is then computed and stored in its respective data structure.

The processor then creates an ordered bucket vector 68 (see FIG. 5) for each partition A and B. The ordered bucket vector 68 orders the placement slots according to the partial gain of the placement slots assigned to the particular ordered bucket vector 68. If any placement slot is empty, then its partial gain is defined to be 0.

A pair of placement slots, one from the ordered bucket vector 68 of partition A and one from the ordered bucket vector 69 of partition B, are then chosen such that swapping the slots results in a maximum gain. Several well known methods can be used to determine the maximum gain pair of placement slots which may be selected. A preferred method first considers the placement slots from each ordered bucket vector having the highest partial gain. The resulting total gain from their swap is then used as a bounding criteria to limit the search for the best pair of placement slots to be swapped.

Figure 5:
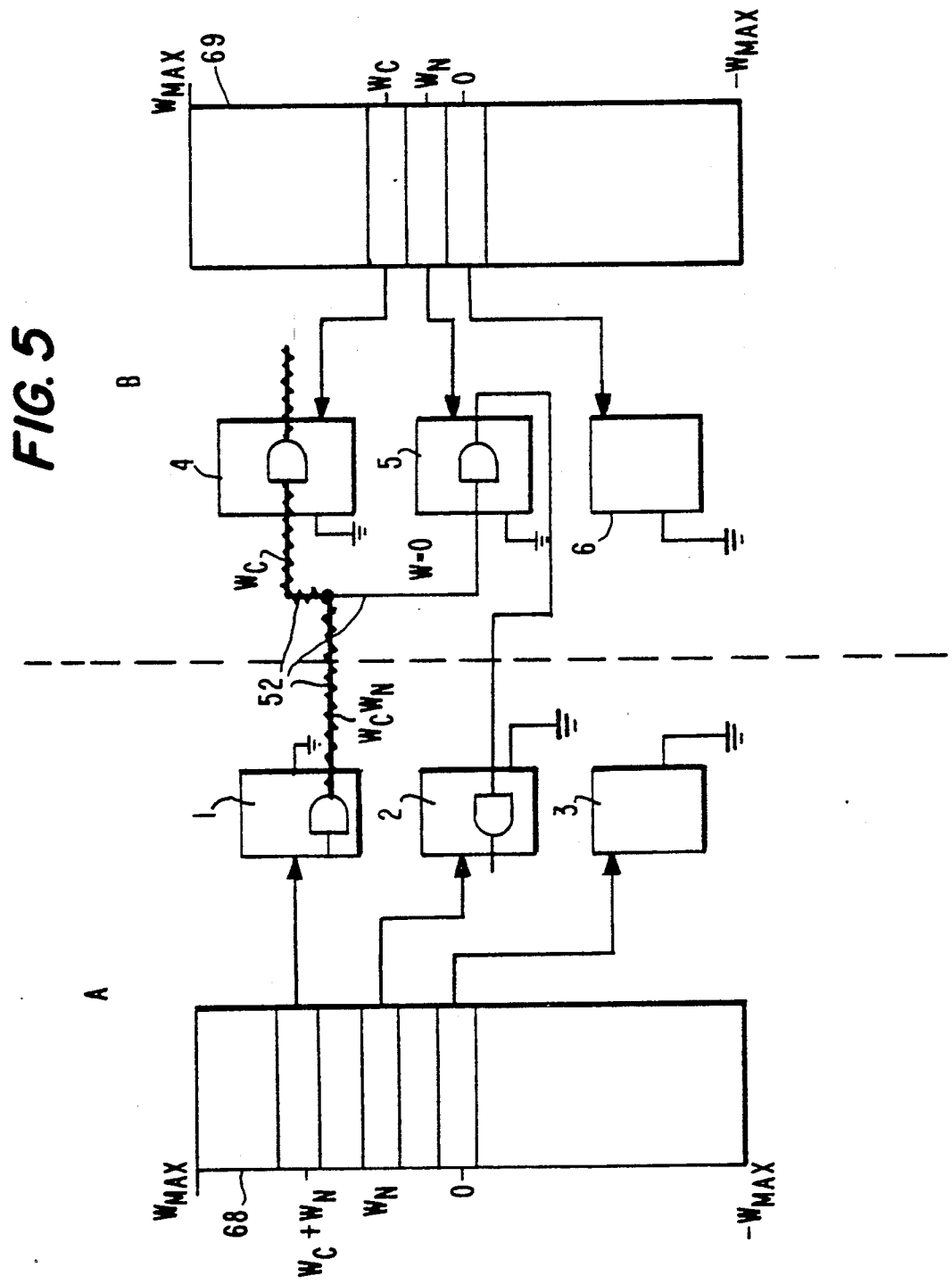
FIG. 5 is an example used to explain the operation of the partitioning method.

FIG. 5 and Table A illustrate a simple example of placement slot selection incorporating the critical driver/load weighting of the invention. Ordered bucket vectors 68 and 69 are shown for each partition A and B, respectively. Further, linked lists of placement slots 1-3 and 4-7 are shown located in partitions A and B, respectively. For illustrative purposes, the connections between placement slots 1-6 are shown.

TABLE A

| Slot | Partial Gain |
|---|---|
| 1 | $W_c + W_N$ |
| 2 | $W_N$ |
| 3 | 0 |
| 4 | $W_c$ |
| 5 | $W_N$ |
| 6 | 0 |

Table A shows the cost for each of the placement slots 1-7 prior to any swapping. The ordered bucket vector 68 for partition A forms linked lists of the placement slots 1-3 depending upon their partial gains which are functions of their costs. Note that the input port on slot #5 has a weight equaling 0 because it is non-critical and cannot affect the cut-set; also note that the input port of slot #4 (on same signal 52) has a weight of $W_c$ based on the result of the timing analysis. Slot #1, still on the same signal 52, has a cost of $W_c + W_N$ because it affects both the critical path and the size of the cut-set. As seen in FIG. 5, placement slot #1 has the highest partial gain equivalent to $(W_c + W_N)$, i.e., the weighted cost of its connections. Therefore, the ordered bucket vector 68 has a first linked list including only placement slot #1.

Similarly, placement slot #2 has a partial gain of $W_N$ and slot #3, which is an empty placement slot, has a partial gain equalling zero. Therefore, the ordered bucket vector 68 has three linked lists which contain one placement slot each. Ordered bucket vector 69 for partition B similarly has four linked lists.

Accordingly, the placement slots having the highest partial gains, e.g. slots #1 and #4, are initially selected for the swapping of their contents. Theoretically, the best total gain possible is the sum of the partial gains for slots #1 and #4, equaling $2W_c + W_N$. In actuality, however, swapping slots #1 and #4 only produces a gain of zero. This is because the placement slots are coupled to each other such that moving slot #1 to partition B produces a partial gain of $W_c + W_N$, but moving slot #4 to partition A results in a partial gain of $-W_c - W_n$. The partial gains are summed to obtain an overall gain of zero. Therefore, zero becomes the initial bounding criteria for further swaps.

Because there are no other placement slots in the linked list 69 for partition B having a partial gain of $W_c$, the next highest partial gain placement slot (in this case slot #5 having a partial gain of $W_N$) is selected to be swapped with placement slot #1. This results in a total gain of $W_c$ which then becomes the new bounding criteria.

Next, placement slot #6 is selected for swapping with slot #1 which results in a gain of $W_c + W_N$. This then becomes the new bounding criteria for determining when no further swaps need be compared for finding the maximum gain pair. It can be seen that the bounding criteria of $W_c + W_N$ is the best total gain possible in this example as swapping slots #1 and #7 cannot produce a gain better than $W_c + W_N$. Therefore, the search terminates with this solution.

The maximum gain pair, i.e., slots #1 and #6, is then swapped and placed onto the swap history vector 90 for later processing. After the swap occurs, the processor removes the placement slots involved in the particular swap (#1 and #6) from their ordered bucket vectors 68, 69 and the models are marked as inactive (fixed) for the remainder of the pass. The process is again repeated for the remaining placement slots marked active.

The swap history vector 90 thus records the evolving history of the partitions as each swap occurs by successively placing the swapped pair onto the swap history vector 90 in locations 94–105. Further, the cumulative sum of the gains from the beginning of this pass are also placed on the swap history vector 90 as shown by the graph 106 in FIG. 4. The cumulative gain begins at 0 and may be positive at some points and negative at others.

After each swap, the ordered bucket vectors 68, 69 in each partition A, B are then updated. Signal counters are associated with the signals and partitions to keep track of various signal and partition parameters including the: free model count of partitions A and B (those models not yet fixed); fixed model count of partitions A and B; fixed model critical load count of partitions A and B; free critical model load count of partitions A and B; fixed critical model driver count of partitions A and B and the free critical model driver count of partition A and B. The signal counters are also updated to reflect each swap. The placement slots which contain models with updated partial gains must then be removed and reinserted in their correct position in the ordered bucket vectors 68, 69.

Once all of the swaps have been attempted, or at least a desired number thereof, the best solution of the design, which is determined from the swaps, is restored to the last point of maximum cumulative gain 92 by replaying the swap history vector 90 in its reverse order. After each replayed swap, the signal counts must again be updated and some models may need to have their partial gain changed thus necessitating removing and reinserting of the model's placement slot in the ordered bucket vectors 68, 69.

It is empirically observed that the number of swaps required to reach a local optima, i.e., the best solution found, decreases with each successive pass. A preferred percentage of the total number of swaps necessary to reach a local optimum has been found to be approximately 55% on the first pass, 55% on the second pass, 40%, 20%, 10% etc. Therefore, replaying the swap history vector 90 in reverse order, in conjunction with the decreasing number of swaps which are considered on each pass, reduces the time and effort required by the processor such that the solution can be obtained in linear time with respect to the number of ports. The ability to operate in linear time with respect to the number of ports while individually weighting the connections between models reduces the time required to perform both logical and physical design.

Once no sequence of swaps are found which result in a positive cumulative gain, then the method has reached its local minima. However, the local minima is not always a global minimum, i.e., different initial solutions can produce different local minimas. Consequently, a user-defined number of random starts, i.e., random initial placements, are made and the best solution found is restored.

Each partition A and B is then placed onto a linked list data structure of partitions which await further bisection. Each of the partitions A and B are subsequently selected and the above method is again applied. The partitions are bisected in a breadth-first fashion to ensure uniform size among all partitions and to ensure that any timing estimation error introduced is also uniform between partitions.

The above method is performed until the partitions contain less than a user defined number of placement slots. At this point, a pairwise-interchange location-swapping method is implemented to improve the above result. The pairwise-interchange method effectively computes the signal delay associated with a port and thereby determines whether swapping the contents of two placement slots is beneficial. The prior methods for refining solutions of the above type are either much more computationally intensive or much less accurate than the pairwise-interchange method of the invention.

Figure 6:
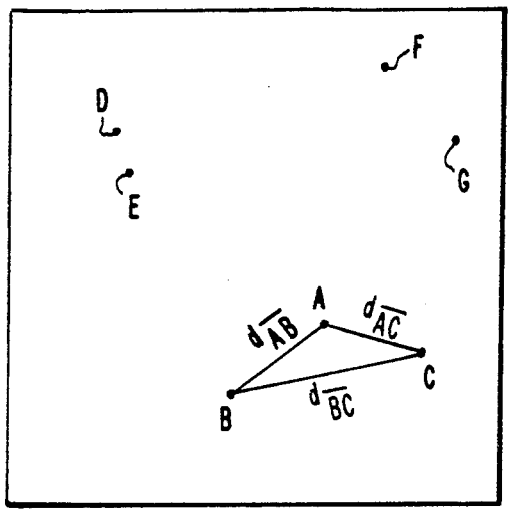
FIG. 6 is an example used to explain the pairwise-interchange method of the present invention.
Figure 7:
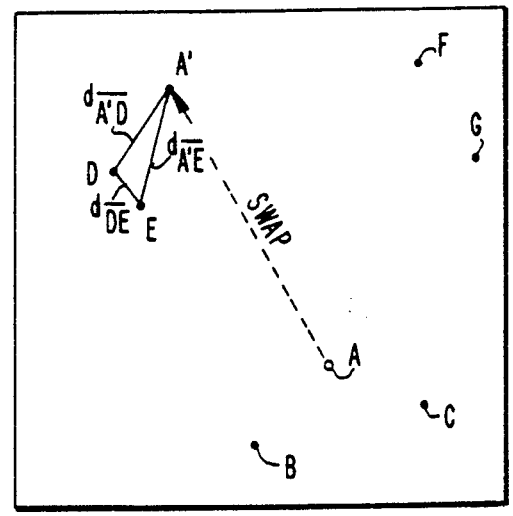
FIG. 7 is an example used to explain the pairwise-interchange method of the present invention.

The pairwise interchange method is shown by example with reference to FIGS. 6 and 7. FIG. 6 shows a partition containing seven ports A–F that form a signal. As an example, given port A, the method locates the nearest two ports, i.e. B, C, in the same signal as port A. The method computes the delays between all of the vertices of the triangle (A, B), (A, C), and (B, C). Of the three arcs AB, AC, BC, the longest are BC is then discarded.

The signal delay "d" associated with the resulting paths from A to B ($d_{AB}$) plus A to C ($d_{AC}$) is then compared to the delay of the connection which was discarded, i.e., $d_{BC}$. The difference "$d_A$", equivalent to: $d_A = (d_{AB} + d_{AC}) - d_{BC}$, is then returned as the value of port A's contribution to the signal delay at port A's location. The difference value is thus computed for one location of port A as well as for a swapped location of port A. FIG. 7 shows the swapped position of A as location A'. In the event of there being only two ports in the signal, then the method returns the delay "d" as that from port A to the single nearest port, e.g., $d_{AX}$.

Repeating the process for location A', the vertices of the triangle A'DE have their signal delays computed for each connection, A'D, DE, A'E. It is apparent from FIG. 7 that the longest arc A'E will thus be discarded and the delay from the resulting path connections A'D plus DE is then computed and compared against the discarded signal, delay connection A'E. The difference, $d_{4'}$, is compared with the preswap difference $d_4$. Further, the differences for each port on the swapped models are computed both prior to and after a location swap. The swap is thus an improvement if the overall contribution to delay from the model is less after the swap than before the swap.

The above described pairwise interchange method is operated a user defined number of times to improve the overall solution to the physical design achieved from the partitioning method.

The detailed design of the physical placement process, including both the partitioning and pairwise interchange methods, is described with reference to the routine calling hierarchy shown in Tables B, C and D.

TABLE B
```
CONTROL FLOW:
    PLACE DESIGN
        SET LOCATION OF PARTITION
        CLEAR ALL WIREDELAYS
        SET TIMING PARAMETERS
        RECURSIVELY DIVIDE PARTITION
            DIVIDE PARTITION
                SET LOCATION OF PARTITION
                SET SLOTS OF PARTITION
                    SET LOCATION OF MODEL
            CLEAR BEST MODEL
            MIN CUT
            RESTORE BEST MODEL
            SET ESTIMATED WIREDELAYS
            SET TIMING PARAMETERS
            PAIRWISE INTERCHANGE
```

TABLE C
```
MIN CUT
    CLEAR MARKS AND COUNTS OF PARTITION
        CLEAR SIGNAL COUNTS
    SET PARTIAL GAIN COUNTS
        INCR COUNTS OF SIGNAL
            INCR COUNTS OF SIGNAL FOR DRIVER
                PROJECTS ONTO PARTITION
                LOCATION IS IN BOX
                PORT WOULD BE CRITICAL
            INCRE COUNTS OF SIGNAL FOR LOAD
                PROJECTS ONTO PARTITION
                LOCATION IS IN BOX
                PORT WOULD BE CRITICAL
        ADD SLOTS TO ORDEREDBUCKETVECTOR
            CALC PARTIAL GAIN OF MODEL
                PORT WOULD BE CRITICAL
                PARTIAL GAIN OF CRITICAL SIGNAL LOAD
                    FIXED CRIT DRIVER COUNT
                    FREE CRIT DRIVER COUNT
                    PARTIAL GAIN OF NONCRITICAL
                        SIGNAL
                        FIXED COUNT OF PARTITION
                        FREE COUNT OF PARTITION
                PARTIAL GAIN OF CRITICAL SIGNAL
                    DRIVER
                    FIXED CRIT LOAD
                    FREE CRIT LOAD COUNT
                    PARTIAL GAIN OF NONCRITICAL
                        SIGNAL
            INSERT SLOT INTO ORDEREDBUCKETVECTOR
                BUCKET OF SLOT
    FIND MAX GAIN SWAP
        MAX GAIN OF ORDEREDBUCKETVECTOR
        IS A LEGAL SWAP
        PARTIAL GAIN OF INTERNAL CONNECTIONS
            PORT WOULD BE CRITICAL
            PARTIAL GAIN OF CRITICAL SIGNAL LOAD
            PARTIAL GAIN OF CRITICAL SIGNAL
                DRIVER
            PARTIAL GAIN OF NONCRITICAL SIGNAL
            FIND PORT ON SIGNAL
            FIND PORT ON CRITICAL SIGNAL
        FIND NEXT LOWER NONEMPTY BUCKET
```

TABLE C-continued
```
        REMOVE SLOT FROM ORDEREDBUCKETVECTOR
            BUCKET OF SLOT
            FIND NEXT HIGHER NON EMPTY BUCKET
            FIND NEXT LOWER NON EMPTY BUCKET
        REORGANIZE ORDEREDBUCKETVECTOR
        UPDATE LOADS OF MODEL
            INCR PARTIAL GAINS OF ALL FREE CRIT
                DRIVES IN
            UPDATE CUTSET COUNTS
                FREE COUNT OF PARTITION
                FIXED COUNT OF PARTITION
            INCR PARTIAL GAINS OF ALL FREE
                MODEL IN
                    INCR PARTIAL GAIN OF ALL
                        PORT IN
        UPDATE DRIVES OF MODEL
            INCR PARTIAL GAINS OF ALL FREE CRIT
                LOADS IN
            UPDATE CUTSET COUNTS
    RESTORE BEST SOLUTION
    PERFORM THE SWAP
        PLACE MODEL IN SLOT
            SET LOCATION OF MODEL
```

TABLE D
```
PAIRWISE INTERCHANGE
    IS A LEGAL SWAP
    PLACEMENT COST OF MODEL
        DIFFERENCE IN SIGNAL LENGTH
            GET CLOSEST TRIANGLE
            DELAY FUNCTION
        DELAY FUNCTION
    PERFORM THE SWAP
    SET LOCATION OF MODEL
    TOTAL PLACEMENT COST
        PLACEMENT COST OF MODEL
```

Table B shows the PLACE DESIGN routine which is a high level function routine. PLACE DESIGN begins with a random assignment of models to placement slots. The PLACE DESIGN routine then calls: SET LOCATION OF PARTITION to define the x, y coordinates of the partitions; CLEAR ALL WIRE DELAYS to allow the routine to determine which wire delays are critical; SET TIMING PARAMETERS to perform the timing analysis on the logic design; and RECURSIVELY DIVIDE PARTITION to divide the particular partition into two further partitions, which are again divided recursively.

The RECURSIVELY DIVIDE PARTITION routine further calls: DIVIDE PARTITION which calls SET LOCATION OF PARTITION to actually divide the partition using a "bounding box" method, wherein the x, y coordinates of the minimum enclosing rectangle containing all of the placement slots in the partition are divided in half along either the x or y coordinate (horizontal or vertical axis). This forms two partitions.

The DIVIDE PARTITION routine then also calls the SET SLOTS OF PARTITION which calls SET LOCATION OF MODELS to determine the linked list of placement slots that are in each partition and to define the location of the models as being at the center of the partition.

The RECURSIVELY DIVIDE PARTITION routine also calls: CLEAR BEST MODELS to store a linked list of the best placement slots of the partition (this is done because subsequent passes will randomize the placement slots); MINCUT which actually performs the work of determining the swaps as will be described further below; RESTORE BEST MODEL to restore the best solution found during MIN CUT;

SET ESTIMATED WIREDELAYS to factor into account new delays introduced due to the swapping of models by reestimating the wire delays; SET TIMING PARAMETERS to again perform the timing analysis; and PAIRWISE INTERCHANGE to perform the pairwise interchange method to refine the solution obtained from the partitioning method.

The MIN CUT hierarchy routine is shown in Table C and is described below. The MIN CUT routine calls: CLEAR MARKS AND COUNTS OF PARTITION (MARKS indicate whether models are either free or fixed, i.e., active or inactive) which sets the marks and signal counts equal to zero; and SET PARTIAL GAIN COUNTS which calls other routines to set up the counts for the signals and partitions. The count parameters associated with signals and partitions include the: free count of partitions A and B; fixed count of partitions A and B; fixed critical load count of partitions A and B; free critical load count of partitions A and B; fixed critical driver count of partitions A and B and the free critical driver count of partitions A and B.

The MIN CUT routine further calls ADD SLOTS TO ORDERED BUCKET VECTOR which calculates the partial gain of the models and inserts their placement slots into the appropriate slot in the ordered bucket vector, i.e, the placement slots are indexed in the ordered bucket vector by their partial gains. This is done by summing the partial gains of the individual inputs and outputs, which is the sum of the critical and non-critical gains, at the signals that are on the model. The MIN-CUT routine also calls: FIND MAX GAIN SWAP which determines the maximum gain pair of placement slots to be swapped by factoring into account the critical driver/load connections; REMOVE SLOT FROM ORDERED BUCKET VECTOR which removes the maximum gain slots from the ordered bucket vector; REORGANIZE ORDERED BUCKET VECTOR which reorganizes the vector based on the changes in the partial gains made because of the swapping. Reorganizing the ordered bucket vector is analagous to the process of originally creating ordered bucket vectors.

Finally, the MIN CUT routine calls RESTORE BEST SOLUTION which performs the stored swaps in the swap history vector in a reverse order to restore the best solution.

The RECURSIVELY-DIVIDE PARTITION routine is performed a user definable number of times to further divide the partitions in a breadth first fashion until the PAIRWISE INTERCHANGE routine (Table D) can be called. The PAIRWISE INTERCHANGE routine performs as described above by finding the placement cost of the model by determining the difference in signal length of the closest placement slots forming a triangle. A swap is performed and it is determined whether there is an improvement or not in the delay. If an improvement is achieved, then the swap is performed. Pairwise interchange is performed for all of the placement slots in each of the partitions. It should be noted that at this point the size of the partition is relatively small.

Integrating Logical and Physical Design

The above-described methods are concerned with the physical design of the semiconductor chip. However, the overall goal of electronic hardware design is to construct an electronic device which performs a particular function and which operates within a specified speed range when realized in hardware. Hardware design can be separated into two distinct areas; logical design and physical design. The logical design includes the device function and constraints on device timing which must be satisfied in order for the hardware to operate properly. The physical design, as discussed above, is the physical realization of the logically designed circuit onto a semiconductor chip. Ordinarily, the logical design process is separated from the physical design process due to the complexity of each task.

Because the physical design can create timing problems which can only be solved by redesigning the logic, an iterative process is typically required between physical and logical design. As the design approaches performance limits of a technology, the interaction between the two design phases becomes greater and more iteration time is required.

Figure 8:
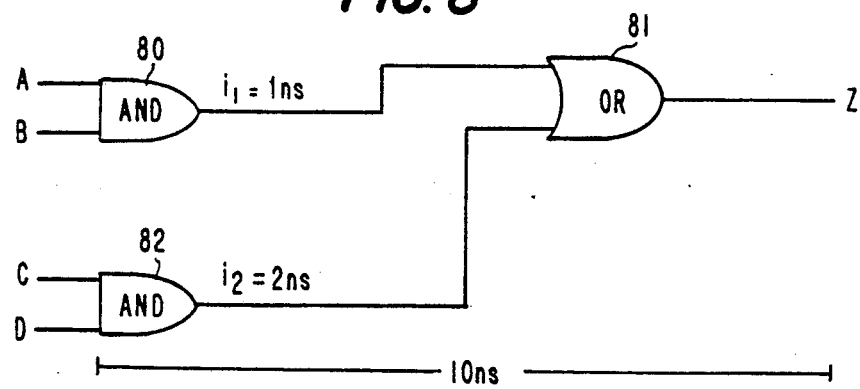
FIG. 8 is an example of a logic circuit used to illustrate the operation of the present invention.

An example of the problem to be overcome, as described above, is given in FIGS. 8–11. FIG. 8 is a simple logic function comprising two AND gates 80, 82 having their outputs coupled to an OR gate 81. Together the three models form a function which is to be mapped into the technology cells as will be described below. The function assumes a timing constraint of ten nanoseconds (ns) (FIG. 8) from the inputs of the AND gates 80, 82 to the output labelled Z from OR gate 81. Further, signals $i_1$ and $i_2$ denote respectively the path from the output of the AND gates 80, 82 to the input port of the OR gate 81. Each signal $i_1$, $i_2$ is shown having a delay equal to one ns.

Figure 9:
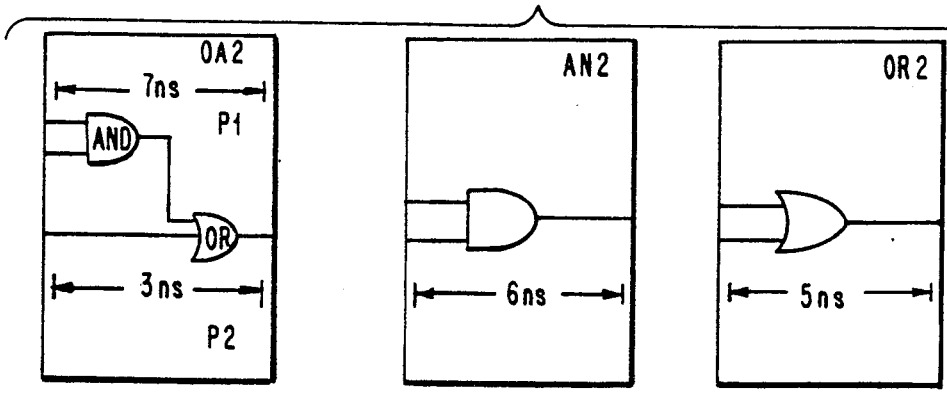
FIG. 9 is a block diagram of three technology cells.

FIG. 9 shows a simple example of three technology cells labelled OA2, AN2, and OR2 which are available to implement the function shown in FIG. 8. The technology cells are defined as a named model that performs some transformation from its input ports to its output ports. The technology cells are the "primitives" for each technology as specified by a manufacturer. The manufacturer subsequently uses the primitives to build a particular design.

For this example, each technology cell is assumed to have the following timing values: cell OA2 = 7 ns through path P1 and 3 ns through path P2; cell AN2 = 6 ns; cell OR2 = 5 ns. The known timing delays of each of the technology cells are important for meeting the timing constraint, i.e., 10 ns of the logic function shown in FIG. 8.

For example, the logic function of FIG. 8 can be implemented with two AN2 cells and one OR2 cell. However, the timing delay to realize the function would be the sum of the timing delays of the cells plus the paths $i_1$ and $i_2$ interconnecting the cells. Thus, the path from the input ports A and B of AND gate 80 to the output port Z of OR gate 81 has a delay equaling the 6 ns delay for cell AN2 plus the 1 ns delay for signal i1 plus the 5 ns delay for cell OR2. The total delay equals 12 ns which violates the 10 ns timing constraint for the function. Similarly, any delay through input ports C and D to output port Z would also equal 12 ns.

An alternative way to implement the function of FIG. 8 uses one OA2 technology cell and one AN2 cell. With this construction, the timing delay through gates 80 and 81 is equivalent to the 7 ns delay through the AND and OR gate contained in technology cell OA2. The delay from gate 82 through gate 81 is equivalent to the delay through cell AN2 (6 ns) and the OR gate path in cell OA2 (3 ns). Thus, the total delay through one path of the function in FIG. 8 is 10 ns and the delay through the other path in FIG. 8 is equal to the 6 ns delay plus the delay i₂ of 1 ns plus the 3 ns delay in cell OA2 equalling 10 ns. Both timing paths are therefore within the timing constraint of 10 ns given in FIG. 8.

Figure 10:
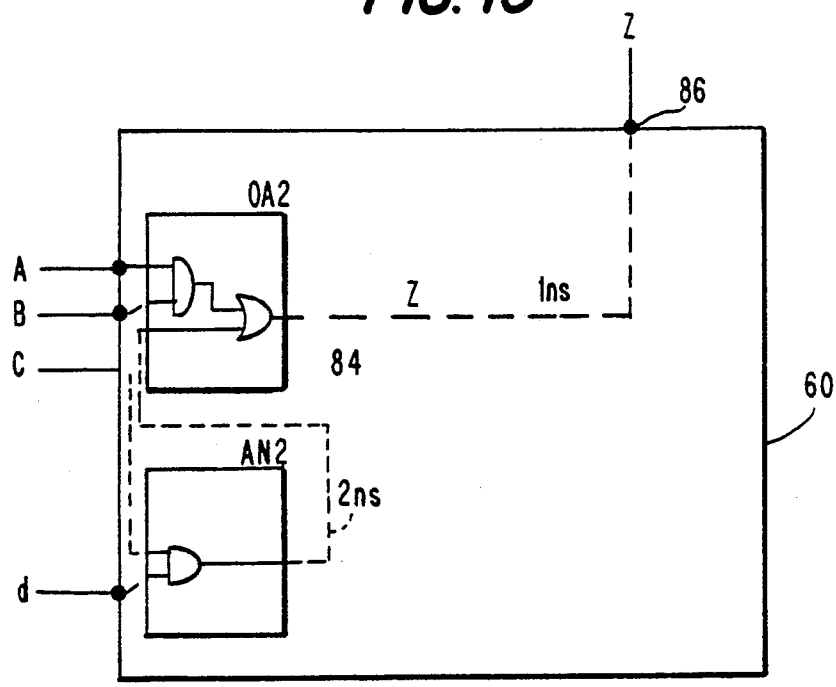
FIG. 10 is a block diagram illustrating the operation of the present invention.

FIG. 10 illustrates how the prior logical and physical design processes were separate and iterative. The logic function in FIG. 8 is designed to use the technology cells described above (OA2 and AN2) during the logical design phase to meet the known timing constraint. The circuit diagram is then forwarded to the physical design phase to be placed on the chip. What often occurs, however, is that when the technology cells are physically placed on an area of the chip, the timing constraints are violated because the logical design caused topological complexity in the physical design resulting in longer wires and added delay or an inefficient load splitting as occurs when a driver is incapable of driving all of the widely spaced loads on a signal. Splitting or clustering is an area in which logical and physical design are tightly coupled as each influences the other. The best partitioning achieves a good clustering of loads which results in low wire delay in the physical design and optimum electrical performance in logical design.

FIG. 10 shows an initial technology cell placement on chip or substrate 60. Due to the location of the external pins A, B, C, D and Z, the delay through one of the AND/OR gate paths is equivalent to the 7 ns delay through cell OA2 plus the 1 ns output delay from points 84 to 86. The other path through the AND/OR gate combination from pins C, D incurs a delay of 6 ns through cell AN2 plus 2 ns routing delay plus 3 ns through cell OA2 plus one ns to the output pin 86. Thus, the total delay from ports C and D to output Z equals 12 ns which violates the 10 ns constraint given in FIG. 5. At this stage in the process, the physical designers return the logic function to the logical designers for redesign in accordance with the pin placement on substrate 60.

The logic designers thus must lessen the total timing constraint from 10 ns to 7 ns [10 ns−(2 ns delay+1 ns from pin placement)]for the path from ports C and D to output Z. Knowing this constraint, the logic designers realize that the path from ports C and D to output Z must be no greater than 7 ns and thus cell OA2 which has a 7 ns delay through the AND and OR gate must be used in the placement of models 82 and 81 (FIG. 8). At this point, control of the overall design process is again passed to the physical designers.

Figure 11:
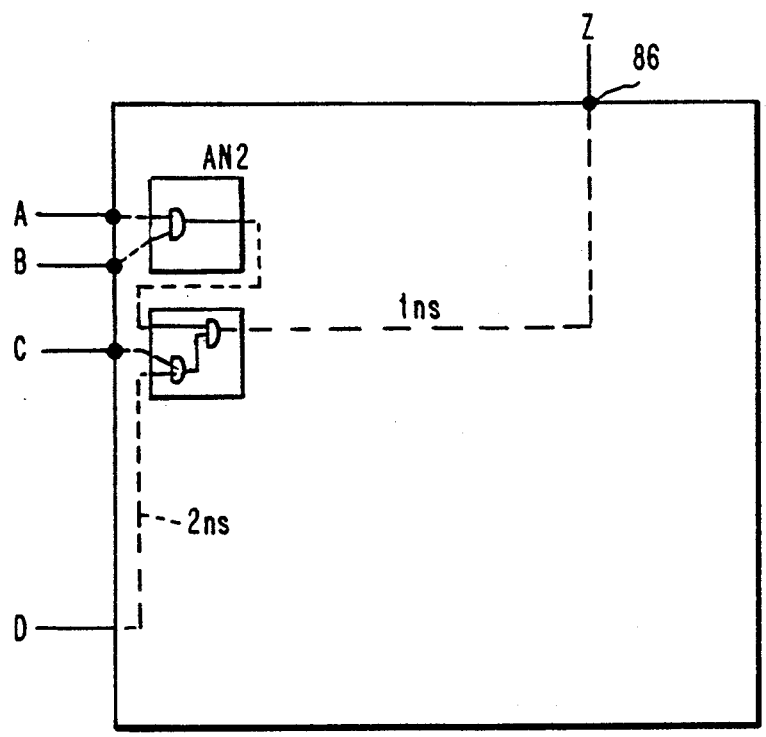
FIG. 11 is a block diagram illustrating the operation of the present invention.

The physical designers then implement the placement shown in FIG. 11 using cell AN2 and cell OA2 to meet all timing constraints given. The delay from ports A and B to output pin 86 equals the 6 ns delay through cell AN2 plus the 3 ns through cell OA2 plus the 1 ns routing time to the pin 86. Similarly, the delay from ports C and D to pin 86 equals 10 ns, i.e. 2 ns from pin D to cell OA2 plus 7 ns through cell OA2 plus 1 ns delay to output pin 86.

It can therefore be seen that this iterative process, conducted separately between logical and physical design, is a time consuming and tedious process. As the design approaches the performance limits of a technology, the interaction between the two design phases becomes even greater and more iteration is required. The method of the present invention automatically solves logical and physical design jointly thus speeding the process and performing it in a more efficient manner.

The present invention further provides a method to overcome the complexity between logical and physical design. The method achieves superior designs by considering both problem areas jointly. The method constructs a physical design based on timing information and a logical redesign based on the placement information.

A design, such as shown in FIG. 1, consists of an interconnection of models, a set of performance goals, e.g. timing constraints, and the parameters to describe the technology, e.g. model delay, maximum drive capability, signal delay, etc.

A timing analysis on the logic design is performed by a software program. One preferred method of performing a timing analysis is described in the commonly owned U.S. patent application Ser. No. 907,514, filed on Sep. 12, 1986 and entitled "Procedure for Incorporating Timing Parameters in the Synthesis of Logic Circuit Designs". The result of the timing analysis determines the amount of "timing debt" on each port of a model, where the timing debt equals the timing delay of a path minus the timing constraint for that path. The optimization of the timing debt on paths is advantageous because it allows the method to weight individual driver-load pairs separately, rather than all the ports on a signal. Therefore, improved performance is achieved by minimizing the positive timing debts of the design.

A physical placement of the design is then performed to a limited partitioning depth using methods described previously. This coarse partitioning places constraints on the logical design by correlating grouping information about the models, e.g. logic design may need to balance loads of a given signal by splitting the models into groups and coarse partitioning provides preferable grouping of models.

Further, based upon the improved timing information which was obtained from the performed placement, the logic can be locally redesigned to better accommodate the critical paths.

From the logic redesign, a final placement is performed using the same partitioning methods previously described. Thus, by using the information available from both the physical and logical designs, each part of the process is enhanced and the overall efficiency and economy of the system is improved.

It therefore can be seen that both logical and physical design require some degree of groupings or clustering. Therefore, by selecting groupings natural for both logical and physical design, a final hardware design satisfying all constraints is achieved quicker and more efficiently than prior iterative approaches.

It is to be understood that while the above invention has been developed for the assigning of circuit components, i.e., models, to supporting structures such as semiconductor chips or substrates, the methods are not limited to this use. The methods are applicable to the dividing of any connected items into partitions to minimize the connections between partitions.

What is claimed is:

1. The computer implemented method of automatically integrating a logical design process and a physical design process for models forming an electronic circuit to minimize an overall design time, the computer implemented method comprising the following steps:
    a) analyzing timing of an initial logic design of said electronic circuit to estimate a timing debt available to interconnect the models within performance limitations;

b) coarsely placing the models of said logic design based upon the estimate of the timing debt and partitioning the models to form a cut-set having connections such that a weighted sum of the connections in the cut-set is minimized;

c) determining whether an additional time delay incurred by including the connections in the cut-set causes the timing debt not to meet predetermined performance limitations; and d) dynamically weighing connections that exceed the performance limitations such that connections that do not exceed the predetermined performance limitations are non-weighted and preferred in said cut-set.

2. The computer implemented method according to claim 1 further comprising the steps of:

e) repeating steps (b)-(d) to successively partition the models forming the electronic circuit.

3. The computer implemented method according to claim 2, wherein the method further comprises the step of:

f) redesigning the logic design based upon new estimates of timing debt obtained at step a).

4. The computer implemented method according to claim 3 further comprising the steps of:

g) repeating steps (b)-(f) until an optimum logic design is achieved; and h) making a final placement of said models based upon said optimum logic design.

* * * * *